(12) United States Patent
Eyres et al.

(10) Patent No.: US 6,273,949 B1
(45) Date of Patent: Aug. 14, 2001

(54) METHOD FOR FABRICATING ORIENTATION-PATTERNED GALLIUM ARSENIDE SEEDING STRUCTURES

(75) Inventors: Loren A. Eyres; Martin M. Fejer, both of Menlo Park, CA (US); Christopher B. Ebert, Vancouver, WA (US); James S. Harris, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 09/394,122

(22) Filed: Sep. 10, 1999

(51) Int. Cl.[7] .................................................. C30B 25/18
(52) U.S. Cl. .............................. 117/94; 117/95; 117/101; 117/97; 117/936; 117/954; 257/432; 257/616
(58) Field of Search .................. 117/95, 94, 97, 117/101, 954, 936; 257/616, 432

(56) References Cited

U.S. PATENT DOCUMENTS

| | | | |
|---|---|---|---|
| 4,707,216 | * 11/1987 | Morkoc et al. | 117/101 |
| 4,710,478 | * 12/1987 | Yoder et al. | 437/40 |
| 4,757,030 | * 7/1988 | Galvin et al. . | |
| 4,758,896 | * 7/1988 | Ito | 358/236 |
| 5,091,333 | * 2/1992 | Fan et al. | 117/95 |
| 5,225,369 | * 7/1993 | Su et al. | 437/132 |
| 5,802,232 | 9/1998 | Bhat et al. | 385/122 |
| 6,051,445 | * 4/2000 | Dubey et al. | 438/31 |

FOREIGN PATENT DOCUMENTS 2-312222 * 12/1990 (JP) ...................................... 117/101

OTHER PUBLICATIONS

S. Koh, M. Ebihara, R. Katayama, T. Kondo and R. Ito;. "Sublattice Inversion Epitaxy of Compound Semiconductors for Quadratic Nonlinear Optical Devices"; in proceedings of Nonlinear Optics '98: Materials, Fundamentals and Applications Topical Meeting held Aug. 10–14, 1998, Kauai, Hawaii. p. 230–232. IEEE Catalog #98CH36244; Library of Congress #98–85597.

M.J. Angell, R. M. Emerson, J.L. Hoyt, and J.F. Gibbons; "Growth of Alternating (100)/(111)–Oriented II–VI Regions for Quasi–Phase–Matched Nonlinear Optical Devices on GaAs Substrates"; Appl. Phys. Lett. 64 (23), Jun. 6, 1994.

* cited by examiner

Primary Examiner—Robert Kunemund
(74) Attorney, Agent, or Firm—Lumen Intellectual Property Services, Inc.

(57) ABSTRACT

A method for fabricating gallium arsenide (GaAs) based structure groups with inverted crystallographic orientation to form wavelength converters that utilizes germanium as a crystallographic neutral template layer deposited on a GaAs substrate. A crystallographic inverted gallium arsenide layer is grown on top of the template layer. In a selective trench etching process areas of the substrate are exposed again for a consecutive collective deposition of GaAs.

2 Claims, 3 Drawing Sheets

METHOD FOR FABRICATING ORIENTATION-PATTERNED GALLIUM ARSENIDE SEEDING STRUCTURES

FIELD OF THE INVENTION

The present invention relates to orientation-patterned gallium arsenide seeding structures for use as seeding templates for epitaxial growth of semiconductor structures and especially optical structures of wavelength converters.

BACKGROUND OF THE INVENTION

Laser beams are coherent light beams with a single wavelength. This characteristic makes them ideal light sources to transmit bundled energy or to carry optical signals. Both applications are of growing importance in information technology, medicine, physics and other fields of technology and sciences. The wavelength of the laser light can vary from infra red to ultra violet.

Several methods to generate laser beams have been developed to produce laser light of distinct wavelengths. Lasers made from gaseous and solid-state materials can directly produce beams with relatively wide bandwidths of wavelengths. To produce beams that fulfill special demands for tunability or frequency stability techniques such as nonlinear frequency conversion are mainly used.

A nonlinear frequency converter is capable of converting some fraction of the light from a beam or beams entering the converter into a beam or beams of different wavelengths, which then radiate from the converter. This process is achieved in a several forms. Three of them are: firstly, in a second harmonic generation process a first beam with distinct wavelength enters the converter and a second beam with a different wavelength is exiting; secondly, in a sum or difference frequency mixing process two beams of different wavelength enter and one beam with a wavelength representing the sum or the difference of the entering beams is exiting; thirdly, in an optical parametric generation or optical parametric oscillation process one beam is entering and two different wavelength beams exiting.

The converter is typically made of crystalline material or other materials with large second-order nonlinear susceptibilities. The converter may include mirrors at the front and back end where beams enter and radiate. The mirrrors form an optical cavity and provide optical feedback. The entering beam or beams produce an oscillating polarization in the converter. As a result, a beam with a new and different wavelength or wavelengths radiates from the converter. Fractions of the entering beam or beams that are not converted to a different wavelength typically exit the converter along with the converted beams. It is desirable to reduce the amount of radiating unconverted beams to increase the efficiency of the wavelength converter.

The wavelength conversion process is distributed onto a number of regions arrayed over the entire length of the converter. To achieve high conversion efficiency the contributions from every region has to add up in phase, which is called "phasematching"

In an efficient converter the phasematching between the nonlinear polarization and the radiating beam frequencies is at a maximum.

A technique to achieve phasematching is called "quasiphasematching". Thereby, the regions of the converter are diverted in structure groups that have alternating periodically or aperiodically modulated nonlinear susceptibilities. This structure groups are called domains.

For zincblende semiconductor materials such as Gallium Arsenide and Zinc Selenide, the nonlinear susceptibility of the waveguide can be modulated by a periodically alternating change in the crystallographic orientation of the domains. More specifically, inversion of a zincblende crystalline structure changes the sign of the nonlinear susceptibility. In zincblende semiconductors a grating along the direction of the propagating laser is introduced to the structure groups.

By introducing an additional grating along the direction of propagating laser beam to the domains the quasiphasematched frequency conversion is additionally enhanced. quasiphasematched frequency conversion can be obtained.

The positive and negative domain make up one region which is the fundamental unit of repetition. Each region has a length set by the refractive index of the semiconductor material. The refractive index varies with the wavelength of the propagating laser beam.

The duty cycle of the positive and negative domain within this unit is ideally 50/50 to achieve highest efficiency. In some cases more complicated nonperiodic grating structures can be implemented to perform specialized functions, such as chirped gratings for temporal pulse compression or multiple gratings for simultaneous frequency conversion to multiple different wavelengths.

The periodic inverted crystallographic orientation that enables quasiphasematching of nonlinear frequency conversion can be used with two device implementations, so called "waveguide" and "bulk" devices.

A typical Waveguide device consists of a stack of layers of varying refractive index, which serve to confine the laser radiation as it propagates through the device. These devices are useful in applications such as telecommunications, where low power and high efficiency is required. The total thickness of all the layers in such a waveguide device is smaller or equal 10 $\mu$m.

A Bulk device utilizes much thicker apertures, extending from a few 100 $\mu$m up to the cm range in size. In this bulk implementation the laser beams are simply focused with external optical lenses through the converter and no refractive index variations are utilized to enhance guiding of the laser beams. The bulk devices are useful for handling high power laser beams.

To keep the scattering of the beams within the waveguide low, the boundaries between the crystallographyically inverted structures have to be of good optical quality.

U.S. Pat. No. 5,434,700 describes an optical wavelength converter, whereby a number of regions with different non-linear optical susceptibilities are arranged to form an optical waveguide. The patent discloses a bonding method to fabricate the two groups of crystallographically inverted domains. A first GaAs layer deposited on a first wafer has a top layer of indium gallium phosphate (InGaP). The first wafer is flipped upside down and bonded with the InGaP layer on a second GaAs layer of a second wafer. First and second GaAs layer are grown with the same crystallographic orientation. Flipping the first wafer upside down inverts the crystallographic orientation of the first GaAs layer relative to the second GaAs layer. The bonding process is performed by atomic rearrangement, as described in U.S. Pat. No. 5,207,864. In a consecutive step, additional layers of the first wafer only required for the bonding process are removed to leave a 10-nm layer of inverted GaAs bound with a 20-nm layer of InGaP on the second GaAs layer. A mask is patterned over the inverted first GaAs layer leaving apertures and masked areas. In selective etching steps the top GaAs layer and the InGaP layer are removed leaving a pattern of inverted GaAs domains on top of the exposed second GaAs layer. Epitaxially grown layers of GaAs based substrates take on the crystallographic orientation of both layers producing regions of alternating crystallographic orientation.

Another method to create alternating crystallographic domains is described in US. Pat. No. 5,434,700. Masked ion implantation is used to selectively destroy crystalline asymmetry. As a result, a zinc blend based layer is converted in domains with differing optical properties to provide the regions for the wavelength conversion. The method does not invert the crystallographic orientation which is defined during the growth process.

U.S. Pat. No. 5,734,494 also describes arrays of periodic crystallographically inverted GaAs as part of the invention. No fabrication method is disclosed.

Arrays of periodic crystallographically inverted zincblende semiconductors are the central design material of wavelength converters.

However, reliable and simple methods to fabricate wavelength converters from GaAs or zincblende semiconductors materials have not been identified. The current invention addresses this need.

OBJECTS AND ADVANTAGES

Accordingly, it is a primary object of the present invention to provide a reliable method for fabricating optical wavelength converters with regions of crystallographically inverted GaAs that are periodically arrayed.

SUMMARY

Germanium (Ge), as detailed in Sze, *Physics of Semiconductor Devices,* John Wiley and Sons, 1981, has a crystalline structure with a lattice parameter that matches that of GaAs within approximately 0.1%. While Ge and GaAs have very similar crystal structures, Ge is nonpolar and GaAs is polar. In Ge all lattice sites are filled with Ge atoms, while in GaAs certain sites containe Ga and others As. Reversing the locations of the Ga and As atoms produces inverted GaAs of opposite polarity. By defining a special tailored growing environment, GaAs can be epitaxially grown on Ge with inverted crystallographic orientations.

On a base substrate of GaAs, a Ge thin film is deposited. The surface of the substrate has a stepped crystallographic section profile that provides nucleation sites. The Ge thin film is thick enough to provide coverage of the GaAs substrate and to assure a crystallographic insulation. As a result, the molecular forces of the GaAs layer below do not affect the crystallographic orientation of a subsequently deposited secondary GaAs layer.

U.S. Pat. No. 4,707,216 discloses the stepped crystallographic section profile to reduce growth distortions. The vertical crystal planes at each step serve as or nucleation niches, wherein initial seeding molecules are trapped. As a result, the subsequent deposition occurs evenly starting from each niche longitudinal towards the next step. This layered growth process avoids growing distortions in the crystalline structure of the deposited material.

The process relies on using substrates with a slight misorientation away from an exact crystal plane. As a result, an array of atomic steps is produced that runs in a particular direction across the substrate surface.

The stepped section profile remains on the top surface of the Ge thin film. It is essential to provide nucleation sites for a growth of the secondary GaAs on top of the Ge surface crystallographically inverted relative to the GaAs substrate. Further essential conditions for the inverted growth are proper environmental temperature and partial pressures of arsenic and gallium.

U.S. Pat. No. 5,308,444 describes an additional method to further reduce three-dimensional growing distortions of GaAs on Ge. The method described therein makes use of a primary arsenic free environment to cover the Ge surface with Ga before depositing the GaAs in a secondary environment. In a consecutive step a mask is patterned on the top layer for a selective etching process. In this way, the top layer and the Ge thin film are removed and portions of the GaAs substrate are exposed. The remaining top layer areas and the exposed areas of the GaAs base substrate represent a periodical array of alternating inverted crystallographic domains. In a following epitaxial growth step a GaAs layer is deposited, wherein both crystallographic orientations are formed concurrently. Three-dimensional growing distortions of the secondary GaAs on the Ge thin film are low and small because of the good crystallographic matching between Ge and GaAs. To overgrow those distortions, relatively little additional GaAs has to be deposited on top of the Ge thin film and the total height of the GaAs top layer can be kept very low.

The height difference or corrugation height between the secondary GaAs layer and the GaAs substrate for the concurrent growth process is just a few hundred Angstroms. Since Corrugation heights between structures with different optical properties reduce the optical propagation, the inventive method helps to increases the efficiency of optical wavelength converters.

DETAILED DESCRIPTION

Although the following detailed description contains many specifics for the purposes of illustration, anyone of ordinary skill in the art will appreciate that many variations and alterations to the following details are within the scope of the invention. Accordingly, the following preferred embodiment of the invention is set forth without any loss of generality to, and without imposing limitations upon, the claimed invention.

Figure 1:
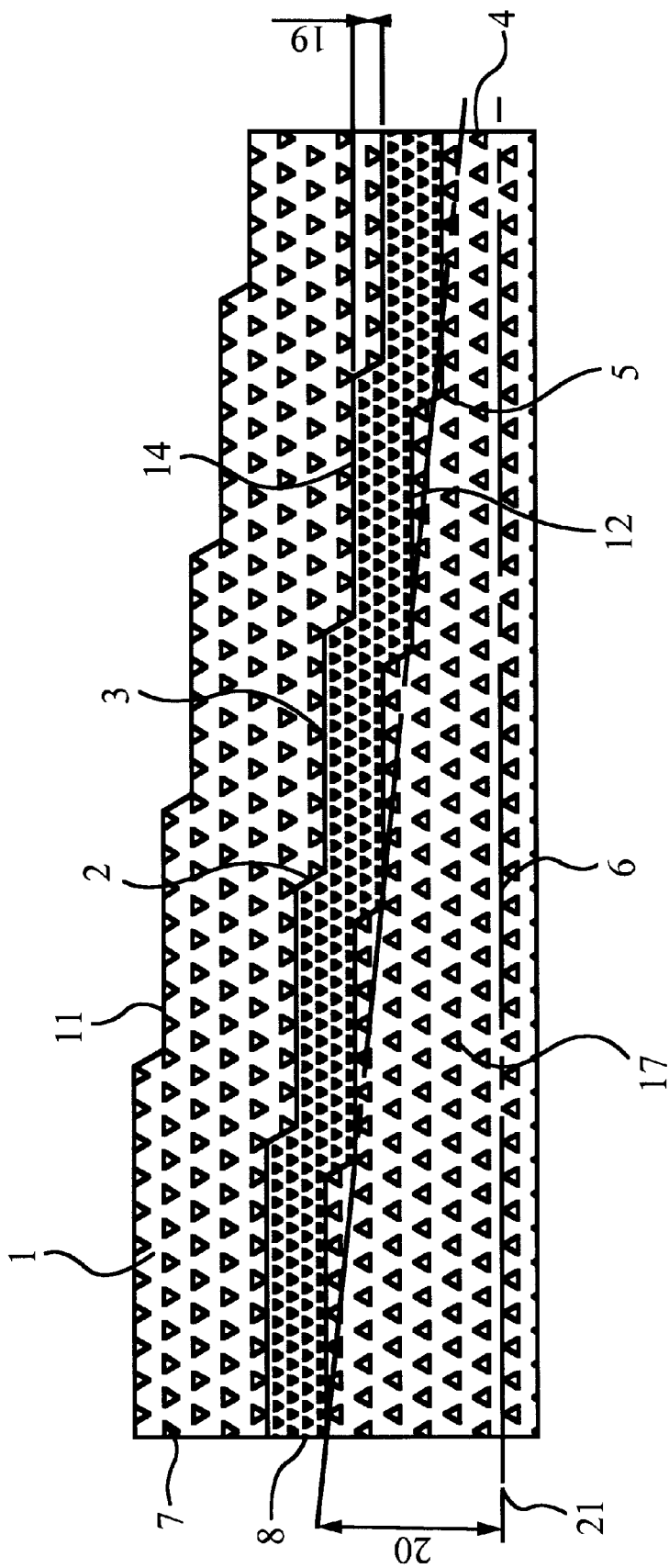
FIG. 1 shows a schematic section view of a GaAs wafer area with deposited Ge thin film and a crystallographic inverted GaAs top layer.

FIG. 1 shows a simplified section area of a wafer between first and second boundary 4, 7. A GaAs substrate 6 consisting of regular oriented crystals 17 has a crystallographic reference plane 21 with a first crystallographic orientation. A stepped surface 12 with primary nucleation sites 5 forms a base for the deposition of a Ge thin film 8 with a Ge top surface 14. The stepped surface 12 is defined by the step height 19 and step angle 20. The stepped surface 12 represents a breaking line of the crystal structure of the GaAs substrate 6. A typical step height 19 is approximately 2.5 Angstrom and represents the height of one half of a GaAs unit cell. The step angle 20, suitable for the deposition of the Ge thin film 8 is typically 4 degrees relative to the crystallographic reference plane 21.

The stepped surface 12 has an three-dimensional orientation that matches the crystal structure of GaAs such the that the steps run continuously along the crystal orientation.

A Ge thin film 8 is deposited to a typical thickness of 30 Angstrom on the primary GaAs substrate 6. With this thickness, the primary GaAs substrate 6 hardly effects or influences the crystallographic orientation of subsequently grown GaAs layers.

Since the Ge thin film grows in two-dimensional crystalline layers on the stepped surface 12, the contour of the stepped surface 12 is maintained on top of the Ge thin film 8. As a result, secondary nucleation sites 2 are available for the consecutive deposition of the secondary inverted GaAs layer 1. The secondary inverted GaAs layer 1 is then grown on top of the Ge thin film 8 in a number of two dimensional layers of GaAs crystals 3, inverted with respect to the GaAs substrate 6, consecutively growing above each other. Growing dislocations remain to a minimum, because of the low crystallographic mismatch of just 0.1% between the Ge and GaAs crystal structures.

The larger triangles 3, 17 shown in FIG. 1 symbolize the crystalline structure of GaAs to visualize the crystallographic inversion between the GaAs substrate 6 and the secondary inverted GaAs layer 1.

The small triangles of the Ge thin film symbolize the individual crystalline structure of Ge.

An example of a fabrication is described in the following: in a first fabrication step, the Ge thin film 8 is deposited on the stepped surface 12. A typical growth temperature is 350 degrees. The secondary inverted GaAs layer 1 is deposited in a directly following growing process in a typical height of 200 Angstrom. The deposition condition has in this deposition process a typical temperature of 500–550 degrees. The GaAs deposition process has involved two steps, first employing alternating fluxes of Ga and As with approximately 1 monolayer deposited of each in turn, then utilizing coevaporated Ga and As with As/Ga beam equivalent pressures of ~15 and varying growth rates. With a (001) substrate having a 4 degree misorientation towards [11-0], this combination of substrate and growth conditions results in the secondary GaAs layer 1 being crystallographic inverted with respect to the GaAs substrate 6.

It is appreciated that anybody skilled in the art may alter the parameters described in the example above without diverting from the scope of the invention.

Once the first inverted GaAs crystals have nucleated with inverted crystallographic orientation in the secondary nucleation sites 2, the secondary inverted GaAs layer 1 grows in subsequent two-dimensional crystal layers to a height, where initial three-dimensional growing distortions on the Ge top surface 14 are overgrown. In a realistic growing process, there is a small number of defective domains present, which are crystallographic inverted from the desired crystal structure. Dependent on the quality demands these defects are more or less overgrown in the secondary inverted GaAs layer 1.

Figure 2:
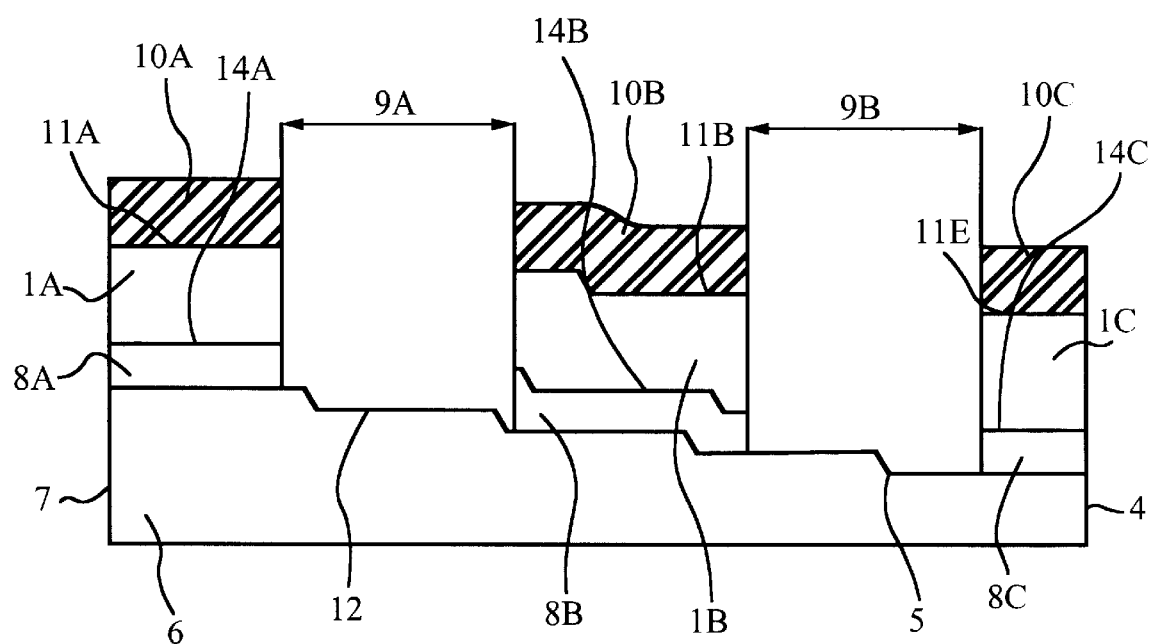
FIG. 2 shows the wafer area of FIG. 1 in a simplified fabrication stage of the invention.

FIG. 2 shows the wafer area of FIG. 1 between first and second boundary 7, 4 in a progressed fabrication level of the invention. Mask patterns 10A, 10B, 10C cover secondary layer segments 1A, 1B, 1C and thin film segments 8A, 8B, 8C during a selective etching process. The mask patterns 10A, 10B, 10C are photo-lithographic created and represent the dimensional array of the periodically inverted domain groups of the final waveguide.

Gaps between the mask patterns 10A, 10B, 10C make the inverted GaAs layer 1 and the Ge thin Film of FIG. 1 accessible for a selective etching process. In a first etching step the inverted GaAs is epitaxially etched away. In a second etching operation the Ge thin film is removed whereby the stepped surface 12 is exposed.

As a result, etching trenches 9A, 9B expose the stepped surface 12 between the second layer segments 1A, 1B, 1C. The width of the etching trenches 9A, 9B is shown out of proportion in FIG. 2 for purposes of visualization. Typical widths of the etching trenches 9A, 9B depend on the application of the final waveguide and vary between 2 and 100 micrometer. The number of etching trenches 9A, 9B shown in FIG. 2 is a fraction of the number fabricated in typical waveguides of optical wavelength converter. The mask pattern 10A, 10B, 10C are removed after the fabrication of the etching trenches 9A, 9B.

Figure 3:
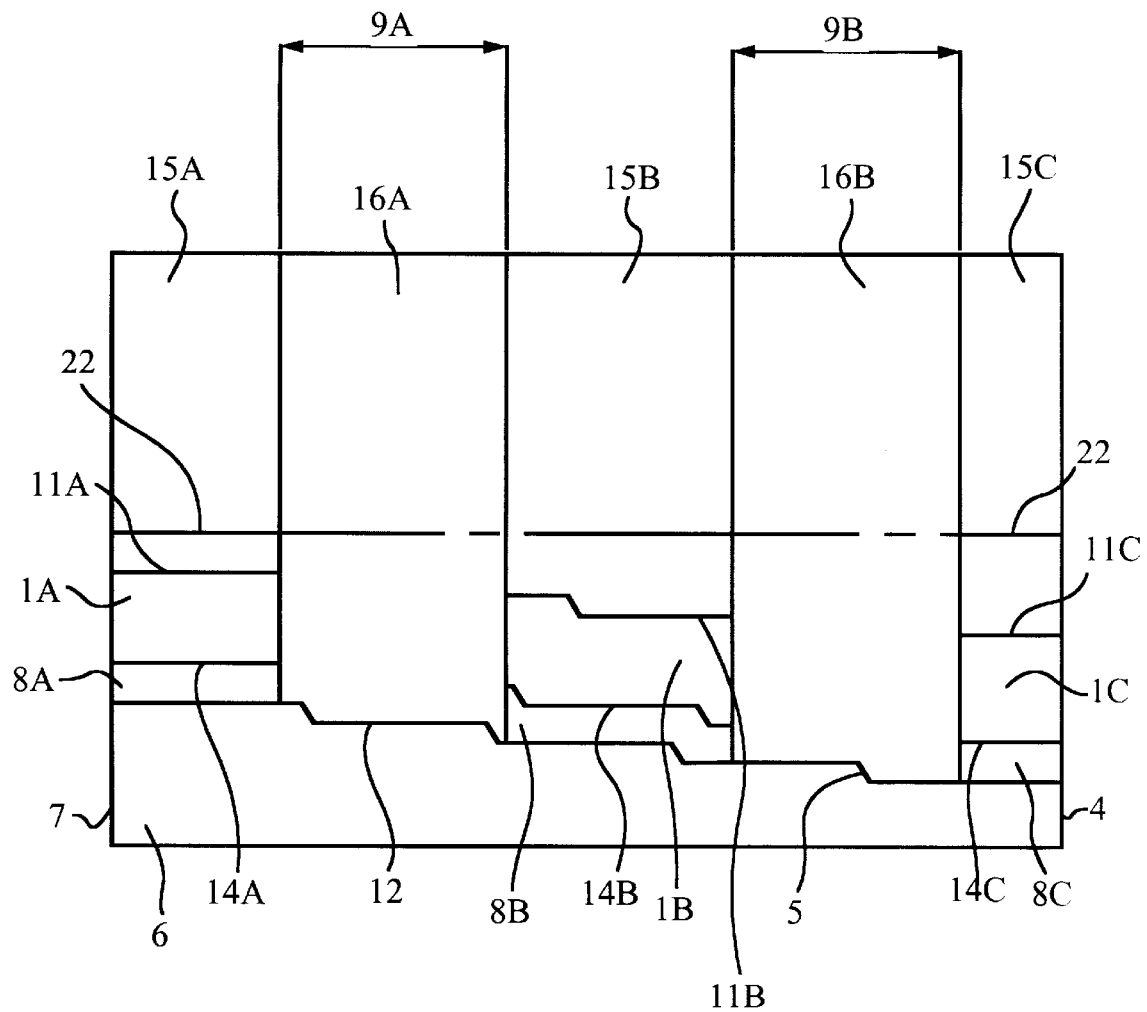
FIG. 3 shows the wafer area of FIG. 1 in a simplified final fabrication stage of the invention.

FIG. 3 shows the wafer area of FIG. 1 between first and second boundary 7, 4 after a collective epitaxial growth process on the GaAs based substrate. FIG. 3 is simplified to visualize the method of the invention. The primary final domains 16A, 16B are epitaxially grown on top of the exposed areas of the stepped surface 12. On top of the surface segments 11A, 11B, 11C are epitaxially grown primary final domains 16A, 16B and secondary final domains 15A, 15B, 15C in continuing crystallographic orientation of the secondary layer segments 1A, 1B, 1C and the exposed areas of the GaAs substrate 1.

The primary and secondary final domains 16A, 16B and 15A, 15B, 15C are the functional parts of the waveguide within a optical wavelength converter. For low power applications where laser beams with average powers up to a few 100 milliwatts travel through the waveguide, the total height of grown structure groups is typically up to 10 $\mu$m. For high power applications where laser beams with up to 100 watts and more pass the waveguide, a bulk height of typically bigger than 200 $\mu$m is fabricated. Bulk heights of 1 cm can be envisioned for high laser power applications.

The primary and secondary final domains 16A, 16B and 15A, 15B, 15C are grown above a minimal leveling height 22 at which the crystalline structure of all domains is free of antiphase domain defects.

In an optional following fabrication step all domains are leveled to the minimal leveling height 22. As a result, seeding structures with inverted crystallographic orientation are available with an even surface for additional deposition.

Materials like for instance ZnSn, GaAS, AlGaAs or InGaAsP based materials can be grown on top of such a prepared crystallographic orientation template. The grating can be thereby substantially periodic, aperiodic or chirped. It is also possible to provide and spatially shaped templates or templates with multiple gratings.

What is claimed is:

1. Method for providing a first seeding structure group and a second seeding structure group accessible placed on a wafer, whereby said first seeding structure group comprises a first crystallographic orientation and said second seeding structure group comprises a second crystallographic orientation inverted relative to said first crystallographic orientation, said method comprising following steps:
   a) providing a GaAs based crystalline substrate surface, whereby said crystalline substrate surface comprises:
      1) a primary crystalline structure; and
      2) a primary crystallographic orientation;
   b) depositing a Ge based thin film of a second material substrate, whereby said second material substrate comprises a crystallographic axis in close lattice match with said primary crystallographic orientation;

c) providing a crystallization environment surrounding said thin film;

d) depositing a secondary GaAs based crystalline structure onto said thin film, whereby said crystallization environment stimulates said second crystallographic orientation in close lattice match to said crystallographic axis and being inverted to said first crystallographic orientation; and e) patterning predetermined areas of said secondary crystalline structure; and f) defining said first seeding structure group and said second seeding structure group by removing said predetermined areas of said secondary crystalline structure and said thin film.

2. An optical wave length converter fabricated by the method of claim 1, wherein said optical wave length converter comprises regions of crystallographically inverted GaAs based material deposited on said first and said second seeding structure group.

* * * * *

UNITED STATES PATENT AND TRADEMARK OFFICE
CERTIFICATE OF CORRECTION

PATENT NO.    : 6,273,949 B1                                            Page 1 of 1
DATED         : August 14, 2001
INVENTOR(S)   : Eyres, Loren A. et al.

It is certified that error appears in the above-identified patent and that said Letters Patent is hereby corrected as shown below:

<u>Column 1,</u>
Line 4, please insert -- This invention was made in part with Government support under contract DAAH04-96-1-0002 awarded by the Department of the Army. The Government has certain rights in this invention. --

Signed and Sealed this

Twenty-first Day of January, 2003

JAMES E. ROGAN
*Director of the United States Patent and Trademark Office*